United States Patent
Kanada et al.

(10) Patent No.: US 9,691,619 B2
(45) Date of Patent: Jun. 27, 2017

(54) LASER ANNEALING DEVICE WITH MULTIPLE LASERS

(71) Applicants: Kazunori Kanada, Fukuoka (JP); Tadaharu Minato, Tokyo (JP); Yusuke Kawase, Tokyo (JP)

(72) Inventors: Kazunori Kanada, Fukuoka (JP); Tadaharu Minato, Tokyo (JP); Yusuke Kawase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 3 days.

(21) Appl. No.: 14/654,089

(22) PCT Filed: Mar. 7, 2013

(86) PCT No.: PCT/JP2013/056296
§ 371 (c)(1),
(2) Date: Jun. 19, 2015

(87) PCT Pub. No.: WO2014/136237
PCT Pub. Date: Sep. 12, 2014

(65) Prior Publication Data
US 2015/0318175 A1    Nov. 5, 2015

(51) Int. Cl.
*H01L 21/268*    (2006.01)
*B23K 26/08*    (2014.01)
(Continued)

(52) U.S. Cl.
CPC ........ *H01L 21/268* (2013.01); *B23K 26/0604* (2013.01); *B23K 26/0622* (2015.10);
(Continued)

(58) Field of Classification Search
CPC . H01L 21/268; H01L 21/324; B23K 26/0081; B23K 26/0604; B23K 26/0622; B23K 26/082; B23K 26/0853
See application file for complete search history.

(56) References Cited

U.S. PATENT DOCUMENTS 5,432,122 A * 7/1995 Chae ................... H01L 27/1281
                                                              117/10
6,172,820 B1 * 1/2001 Kuwahara .......... B23K 26/0738
                                                              219/121.67
(Continued)

FOREIGN PATENT DOCUMENTS

CN        1551309 A      12/2004
CN     100444333 C       12/2008
(Continued)

OTHER PUBLICATIONS

Machine translation of Japan Patent document No. 2004-200,559, Dec. 2016.*
(Continued)

*Primary Examiner* — Geoffrey S Evans
(74) *Attorney, Agent, or Firm* — Studebaker & Brackett PC

(57) ABSTRACT

A laser annealing device of the present invention includes a stage on which a heating object is placed, a first laser element which emits first continuous laser light, a first optical system which leads the first continuous laser light to the heating object to form a first application region on the heating object, a second laser element which emits second continuous laser light having a wavelength shorter than that of the first continuous laser light, a second optical system which leads the second continuous laser light to the heating object to form a second application region on the heating object, and a system controller which executes scanning with the first application region and the second application
(Continued)

region so that each portion of the heating object is scanned with at least part of the first application region before being scanned with the second application region.

9 Claims, 16 Drawing Sheets

(51) Int. Cl.
  H01L 21/324 (2006.01)
  B23K 26/06 (2014.01)
  H01L 29/66 (2006.01)
  B23K 26/082 (2014.01)
  B23K 26/0622 (2014.01)
  B23K 26/073 (2006.01)

(52) U.S. Cl.
  CPC ........ *B23K 26/0732* (2013.01); *B23K 26/082* (2015.10); *B23K 26/0853* (2013.01); *H01L 21/324* (2013.01); *H01L 29/66333* (2013.01)

(56) References Cited

U.S. PATENT DOCUMENTS

| | | | |
|---|---|---|---|
| 2003/0080099 A1 | 5/2003 | Tanaka et al. | |
| 2004/0069751 A1 | 4/2004 | Yamazaki et al. | |
| 2004/0171237 A1 | 9/2004 | Tanaka et al. | |
| 2006/0154456 A1 | 7/2006 | Taniguchi et al. | |
| 2006/0234458 A1* | 10/2006 | Jennings | B23K 26/0066 438/308 |
| 2007/0099401 A1* | 5/2007 | Tanaka | B23K 26/067 438/487 |
| 2008/0014685 A1* | 1/2008 | Govorkov | B23K 26/0604 438/150 |
| 2008/0132041 A1* | 6/2008 | Yamazaki | B23K 26/0604 438/487 |
| 2009/0227121 A1* | 9/2009 | Matsuno | B23K 26/0613 438/795 |
| 2012/0234810 A1 | 9/2012 | Kudo et al. | |
| 2014/0263208 A1* | 9/2014 | Karlsen | B23K 26/0081 219/121.61 |
| 2015/0179473 A1* | 6/2015 | Hunter | H01L 21/2686 438/799 |

FOREIGN PATENT DOCUMENTS

| | | |
|---|---|---|
| JP | H09-063974 A | 3/1997 |
| JP | H10-041244 A | 2/1998 |
| JP | 2001-176814 A | 6/2001 |
| JP | 2004-200559 A * | 7/2004 |
| JP | 2004-349269 A | 12/2004 |
| JP | 2007-273833 A | 10/2007 |
| JP | 2008-085236 A | 4/2008 |
| JP | 2009-302214 A | 12/2009 |
| JP | 2011-119297 A | 6/2011 |
| KR | 2004-0031622 A | 4/2004 |
| KR | 2005-0086962 A | 8/2005 |
| TW | 200423230 A | 11/2004 |
| TW | 201137952 A1 | 11/2011 |
| WO | 2007/015388 A1 | 2/2007 |

OTHER PUBLICATIONS

An Office Action; "Notification of Reason for Rejection," issued by the Japanese Patent Office on Jun. 7, 2016, which corresponds to Japanese Patent Application No. 2015-504066 and is related to U.S. Appl. No. 14/654,089; with English language partial translation.
An Office Action issued by the Korean Patent Office on Jul. 13, 2016, which corresponds to Korean Patent Application No. 10-2015-7024130 and is related to U.S. Appl. No. 14/654,089; with English language translation.
Notification of Transmittal of Translation of the International Preliminary Report on Patentability and Translation of Written Opinion of the International Searching Authority; PCT/JP2013/056296; issued on Sep. 17, 2015.
International Search Report; PCT/JP2013/056296; May 14, 2013.
Ultratech "Laser Processing Product Family", Retrieved from "http://www.ultratech.com/products/laser_family.shtml", Jan. 7, 2013.
EXCICO "LTA Laser" Retrieved from "http://www.excico.com/index.php?option=com_content& view=article&id=117:lta &catid=36:products&Itemid=118", Jan. 7, 2013.
Written Opinion, PCT/JP2013/056296, May 14, 2013.
Taiwan Patent Office, "Office Action" and partial translation of Taiwan Office Action, Feb. 25, 2015.
An Office Action; "The Preliminary Rejection," issued by the Korean Patent Office on Mar. 21, 2016, which corresponds to Korean Patent Application No. 10-2015-7024130 and is related to U.S. Appl. No. 14/654,089; with English language partial translation.
The extended European search report issued by the European Patent Office on Jan. 4, 2017, which corresponds to European Patent Application No. 13876834.6-1702 and is related to U.S. Appl. No. 14/654,089.
T. Seino et al.; "Backside Activation of Power Device IGBTs by Microsecond-Pulsed Green Laser Annealing Thermally Assisted with CW Diode Laser", 18th IEEE Conference on Advanced Thermal Processing of Semiconductors—RTP 2010; Sep. 28-Oct. 1, 2010; 4 pages.
Yuko Arai et al.; "Backside-Activation Technique of Power Device IGBTs by a Microsecond-Pulsed Green Laswer"; 17th IEEE International Conference on Advanced Thermal Processing of Semiconductors—RTP 2009; Sep. 29-Oct. 2, 2009; 4 pages.
Detlef Friedrich; "Laster Annealing of Power Devices"; 15th IEEE International Conference on Advanced Thermal Processing of Semiconductors—RTP 2007; Oct. 2-5, 2007; 7 pages.
An Office Action issued by the Chinese Patent Office on Dec. 16, 2016, which corresponds to Chinese Patent Application No. 2013800743525 and is related to U.S. Appl. No. 14/654,089; with English language translation; 16pp.

\* cited by examiner

FIG. 12 optical constant of each wavelength for single crystal silicon    wave length for calculation nm

| kind | wave length | | penetration length d μm | absorption coefficient α1/cm | extinction coefficient k |
|---|---|---|---|---|---|
| Excimer laser (ArF) | 193nm | 193 | 0.005314343 | 1881700.1 | 2.89 |
| Excimer laser (KrF) | 248nm | 248 | 0.005535824 | 1806415.8 | 3.565 |
| Excimer laser (XeCl) | 308nm | 308 | 0.00671503 | 1489196.5 | 3.65 |
| Excimer laser (XeF) | 351nm | 351 | 0.009313669 | 1073690.8 | 2.999 |
| Nb-YAG laser (primary) | 1064nm | 1064 | 1263.737757 | 7.9 | 6.70E-05 |
| Nb-YAG laser (second) | 532nm | 532 | 0.962163974 | 10393.2 | 0.044 |
| Nb-YAG laser (third) | 355nm | 355 | 0.009354305 | 1069026.5 | 3.02 |
| Nb-YAG laser (fourth) | 266nm | 266 | 0.004782559 | 2090930.7 | 4.426 |
| Nb-YVO4 laser (primary) | 1064nm | 1064 | 1263.737757 | 7.9 | 6.70E-05 |
| Nb-YVO4 laser (second) | 532nm | 532 | 0.962163974 | 10393.2 | 0.44 |
| Nb-YVO4 laser (third) | 355nm | 355 | 0.009354305 | 1069026.5 | 3.02 |
| Nb-YVO4 laser (fourth) | 266nm | 266 | 0.004782559 | 2090930.7 | 4.426 |
| Yb-Fiber | 1090nm | 1090 | 0.025892371 | 386214.1 | 3.35 |
| Er-YAG laser | 2936nm | 2936 | 93455782.58 | 0.0 | 2.50E-09 |
| CO2 laser | 10.6μm | 10600 | 0.66418992 | 15055.9 | 1.27 |
| ruby laser | 694nm | 694 | 4.248212712 | 2353.9 | 0.013 |
| alexandrite laser | 755nm | 755 | 6.675665669 | 1496.0 | 0.009 |
| dye laser | 585nm | 585 | 1.551760695 | 6444.3 | 0.03 |
| semiconductor laser | 650nm~905nm | 650 | 3.232834782 | 3093.3 | 0.016 |
| | | 905 | 14.40352235 | 694.3 | 0.005 |
| He-Ne laser | 633nm | 633 | 2.651186289 | 3771.9 | 0.019 |
| Ar laser | 488nm~514nm | 488 | 0.491567166 | 20343.1 | 0.079 |
| | | 514 | 0.681713673 | 14668.9 | 0.06 |
| liquid laser | 330nm~1300nm | 330 | 0.008395321 | 1191139.6 | 3.128 |
| | | 1300 | 0.025060735 | 399030.6 | 4.128 |
| glass laser | 1060nm | 1060 | 0.021909642 | 456420.1 | 3.85 |

$$I = I_0 e^{-\alpha z} \qquad \alpha = \frac{4\pi k}{\lambda}$$

- $I$ : speed of light
- $I_0$ : initial light intensity
- $z$ : penetration depth
- $a$ : absorption coefficient
- $L$ : wavelength
- $k$ : extinction coefficient

LASER ANNEALING DEVICE WITH MULTIPLE LASERS

TECHNICAL FIELD

This invention relates, for example, to a laser annealing device used to diffuse and activate an impurity introduced in a substrate and to a method of producing a semiconductor device by using the laser annealing device.

BACKGROUND ART

In some cases, laser annealing is performed on a semiconductor substrate in order to diffuse and activate an impurity introduced in a semiconductor substrate by ion implantation for example. Patent Literature 1 discloses a laser annealing device having a pulse oscillation laser element which emits pulse laser light and a continuous (or discontinuous) oscillation laser element which emits near-infrared laser light for assisting annealing. This laser annealing device applies pulse laser light after causing the substrate surface temperature to reach a steady state by applying near-infrared laser light. As a result, an impurity existing at substantially large depths in the substrate is activated by securing sufficiently large light-penetration and heat-diffusion lengths.

PRIOR ART

Patent literature

Patent Literature 1: Japanese Patent Laid-Open No. 2011-119297
Patent Literature 2: Japanese Patent Laid-Open No. 2009-302214
Patent Literature 3: International publication WO2007/015388

SUMMARY OF INVENTION

Technical Problem

Preferably, in a laser annealing process, a heating object is sufficiently heated while scanning with the laser light application region is being performed at a high speed. The technique disclosed in Patent Literature 1, however, has a problem that since a heating object is heated by using pulse laser light, some portions of the heating object are not heated if scanning with the application region is performed at a high speed.

The present invention has been achieved to solve the above-described problem, and an object of the present invention is to provide a laser annealing device capable of sufficiently heating a heating object while scanning with the application region at a high speed and a method of producing a semiconductor device.

Means for Solving the Problems

According to the present invention, there is provided a laser annealing device including a stage on which a heating object is placed, a first laser element which emits first continuous laser light, a first optical system which leads the first continuous laser light to the heating object to form a first application region on the heating object, a second laser element which emits second continuous laser light having a wavelength shorter than that of the first continuous laser light, a second optical system which leads the second continuous laser light to the heating object to form a second application region on the heating object, and a system controller which executes scanning with the first application region and the second application region so that each portion of the heating object is scanned with at least part of the first application region before being scanned with the second application region.

According to the present invention, there is also provided a method of producing a semiconductor device, including applying first continuous laser light to a heating object to form a first application region as a region occupied by the first continuous laser light applied, applying second continuous laser light having a wavelength shorter than that of the first continuous laser light to the heating object to form a second application region as a region occupied by the second continuous laser light applied, and performing scanning with the first application region and the second application region so that each portion of the heating object is scanned with at least part of the first application region before being scanned with the second application region.

Other features of the present invention will be clarified below.

Advantageous Effects of Invention

According to the present invention, use of continuous laser light and execution of preliminary heating enable a heating object to be sufficiently heated while being scanned with application regions at a high speed.

BRIEF DESCRIPTION OF THE DRAWINGS

FIG. 12 is a table showing the example of laser element.

DESCRIPTION OF EMBODIMENTS

A laser annealing device and a method of producing a semiconductor device according to an embodiment of the present invention will be described with reference to the drawings. Components identical or corresponding to each other are indicated by the same reference characteristics and description for them is omitted in some cases.
Embodiment 1

Figure 1:
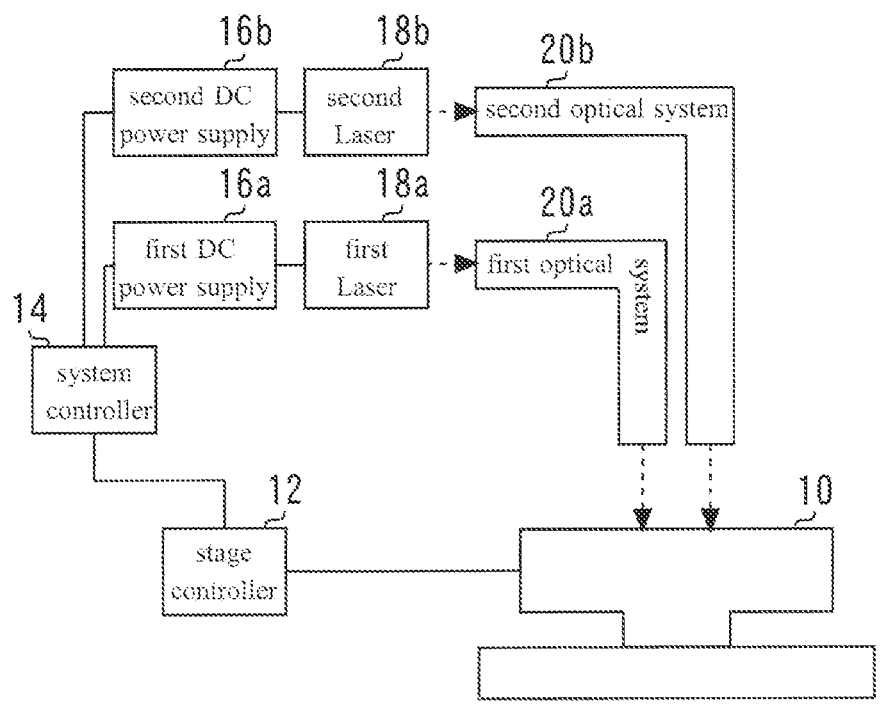
FIG. 1 is a front view of a laser annealing device according to Embodiment 1 of the present invention.

FIG. 1 is a front view of a laser annealing device according to Embodiment 1 of the present invention. This laser annealing device is provided with a stage 10 on which a heating object is placed. A stage controller 12 is connected to the stage 10. A system controller 14 is connected to the stage controller 12. The stage controller 12 receives a command from the system controller 14 and changes the position of the stage 10.

A first direct-current power supply 16a and a second direct-current power supply 16b are connected to the system controller 14. The system controller 14 controls on/off of the first direct-current power supply 16a and the second direct-current power supply 16b. A first laser element 18a is connected to the first direct-current power supply 16a. The first laser element 18a is supplied with a direct-current voltage from the first direct-current power supply 16a and emits first continuous laser light. The wavelength of the first continuous laser light is, for example, 808 nm. A first optical system 20a is formed in a place which the first continuous laser light reaches. The first optical system 20a leads the first continuous laser light to the heating object and forms a first application region on the heating object. The first application region is a region on the heating object occupied by the first continuous laser light applied.

A second laser element 18b is connected to the second direct-current power supply 16b. The second laser element 18b is supplied with a direct-current voltage from the second direct-current power supply 16b and emits second continuous laser light of a wavelength shorter than that of the first continuous laser light. The wavelength of the second continuous laser light is, for example, 532 nm. A second optical system 20b is formed in a place which the second continuous laser light reaches. The second optical system 20b leads the second continuous laser light to the heating object and forms a second application region on the heating object. The second application region is a region on the heating object occupied by the second continuous laser light applied.

Figure 2:
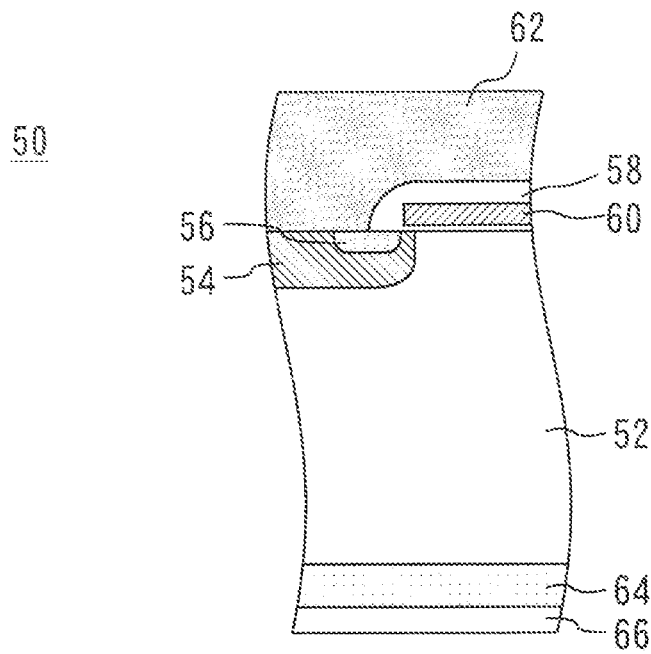
FIG. 2 is a sectional view of a portion of a heating object.

FIG. 2 is a sectional view of a portion of a heating object 50. The heating object 50 is formed of a punch-through type Insulated Gate Bipolar Transistor (IGBT). A process of manufacturing the heating object 50 will be briefly described. A P+ diffusion layer 54, an N+ diffusion layer 56, a gate electrode 60 covered with an oxide film 58 and an emitter electrode 62 are first formed on the upper surface side of an N type semiconductor substrate 52. Aluminum, for example, is used for the emitter electrode 62. Subsequently, the semiconductor substrate 52 is ground at its lower surface side so as to have a thickness of 100 μm for example. Subsequently, an impurity for an N+ buffer layer 64 and an impurity for a P+ collector layer 66 are implanted into the semiconductor substrate 52 at the lower surface side by ion implantation for example.

Figure 3:
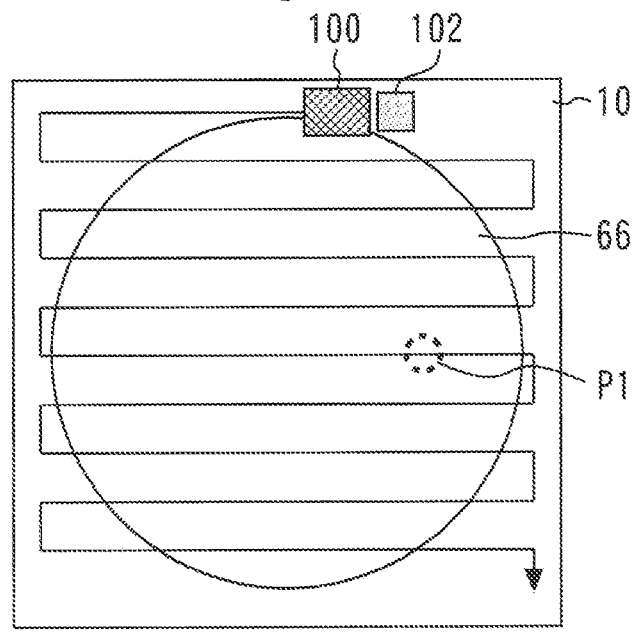
FIG. 3 is a plan view showing a method of scanning with the first application region and the second application region.

In the method of producing a semiconductor device according to Embodiment 1 of the present invention, the impurities in the heating object 50 at the lower surface side are diffused and activated by using the laser annealing device. FIG. 3 is a plan view showing a method of scanning with the first application region and the second application region. The heating object 50 is first placed on the stage 10. Referring to FIG. 3, the collector layer 66 of the heating object 50 appears in the front surface. Scanning with the first application region 100 and the second application region 102 is performed along the direction of the arrow. To realize this scanning, the stage controller 12 receiving a command from the system controller 14 moves the stage 10.

Scanning with the first application region 100 and the second application region 102 is performed in such a manner that each portion of the heating object 50 is scanned with at least part of the first application region 100 before being scanned with the second application region 102. The width of the first application region 100 in the scanning direction and the width of the second application region 102 in the scanning direction, which are 100 μm and 50 μm, respectively, in the above-described example, are not particularly limited to those values.

The system controller 14 executes scanning with the first application region 100 and the second application region 102 so that the speed of scanning with the first application region 100 and the second application region 102 is 50 to 1000 [m/min]. Scanning with the first application region 100 and the second application region 102 may be performed not by moving the stage 10 but by moving the first optical system 20a and the second optical system 20b with the system controller 14.

Figure 4:
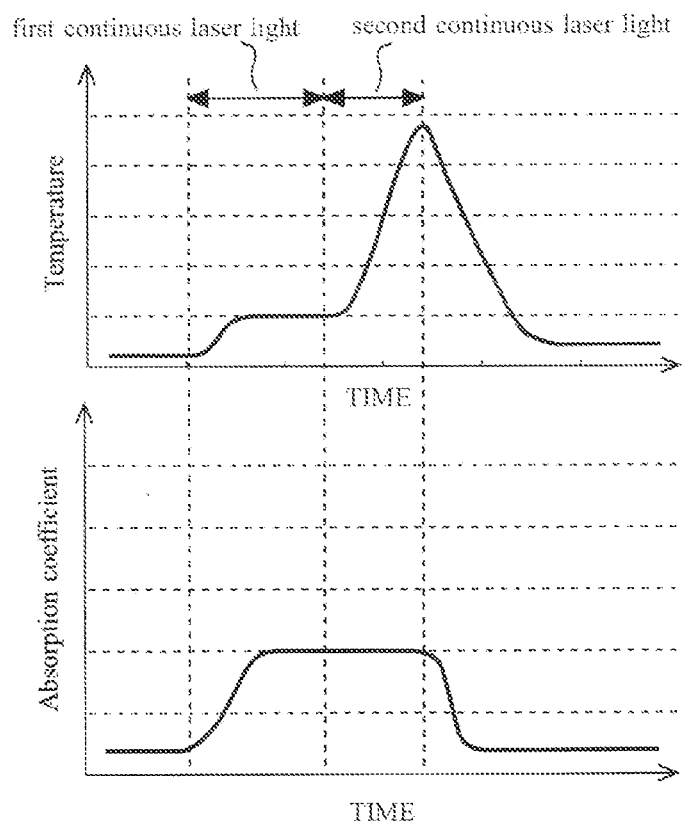
FIG. 4 is a diagram showing changes in temperature and absorption coefficient of the heating object.

FIG. 4 is a diagram showing changes in temperature and absorption coefficient of the heating object. A point of measurement of the temperature and the absorption coefficient exists, for example, in a place indicated by P1 in FIG. 3. The time period for which scanning with the first application region right above the point of measurement continues is represented by "First continuous laser light", and the time period for which scanning with the second application region right above the point of measurement continues is represented by "Second continuous laser light". The absorption coefficient of the heating object is increased by scanning with the first application region. The portion of the heating object in which the absorption coefficient has been increased is scanned with the second application region. Therefore, a higher temperature is reachable at the point of measurement in comparison with a case where scanning with only the second application region is performed.

Figure 5:
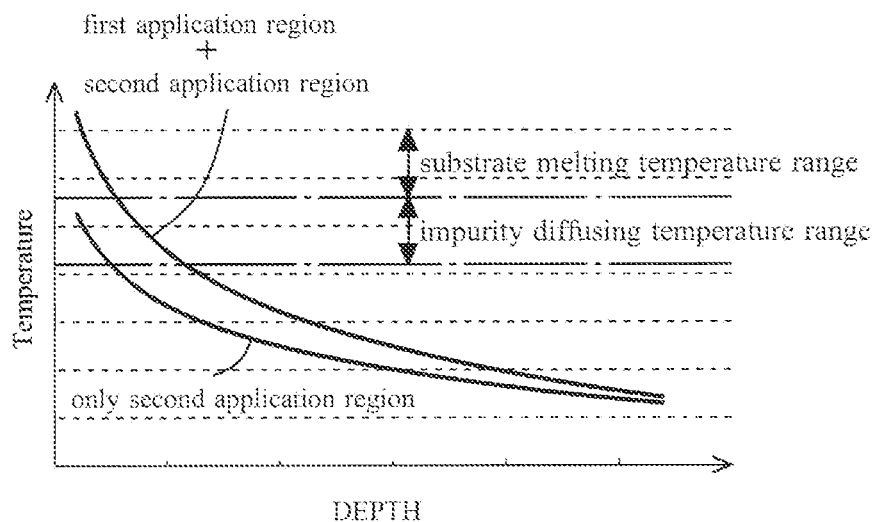
FIG. 5 is a diagram showing a temperature distribution in the depth direction in the heating object in an annealing process.

FIG. 5 is a diagram showing a temperature distribution in the depth direction in the heating object in an annealing process. It can be understood that scanning with the first application region and the second application region enables annealing at a higher temperature in comparison with scanning with only the second application region.

Figure 6:
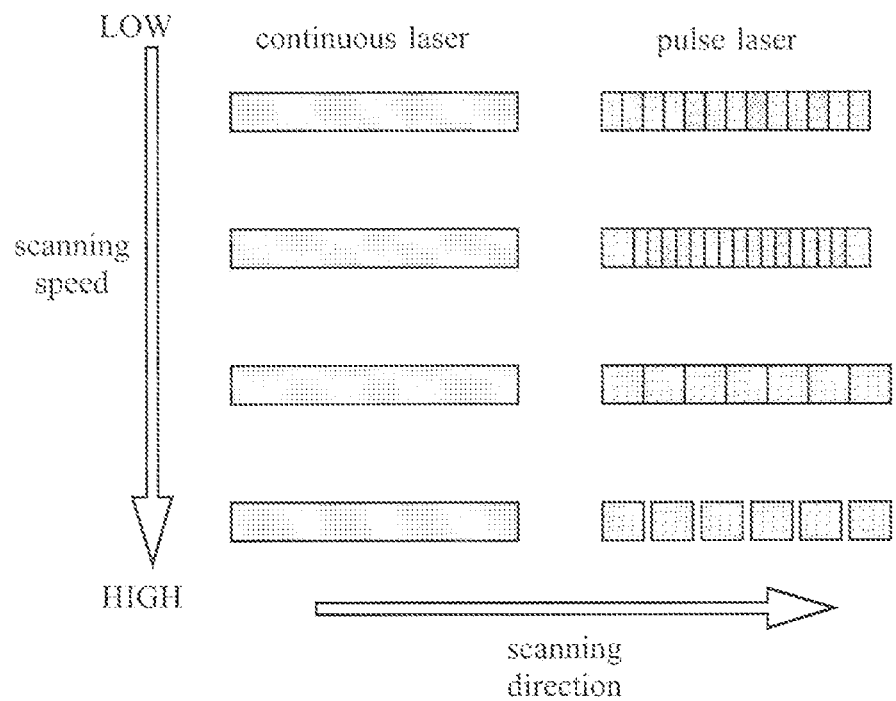
FIG. 6 is a diagram showing a scanning speed dependence of the application range.

In the laser annealing device and the method of producing a semiconductor device according to Embodiment 1 of the present invention, the first continuous laser light and the second continuous laser light are used and the speed of scanning with the first application region and the second application region can therefore be increased. FIG. 6 is a diagram showing a scanning speed dependence of the application range. In a case where continuous laser light is used, no application omission occurs when the scanning speed is increased. In contrast, in a case where pulse laser light is used, application omissions occur when the scanning speed is increased. Use of continuous laser light enables increasing the speed of scanning with the first application region and the second application region without any application omissions.

Figure 7:
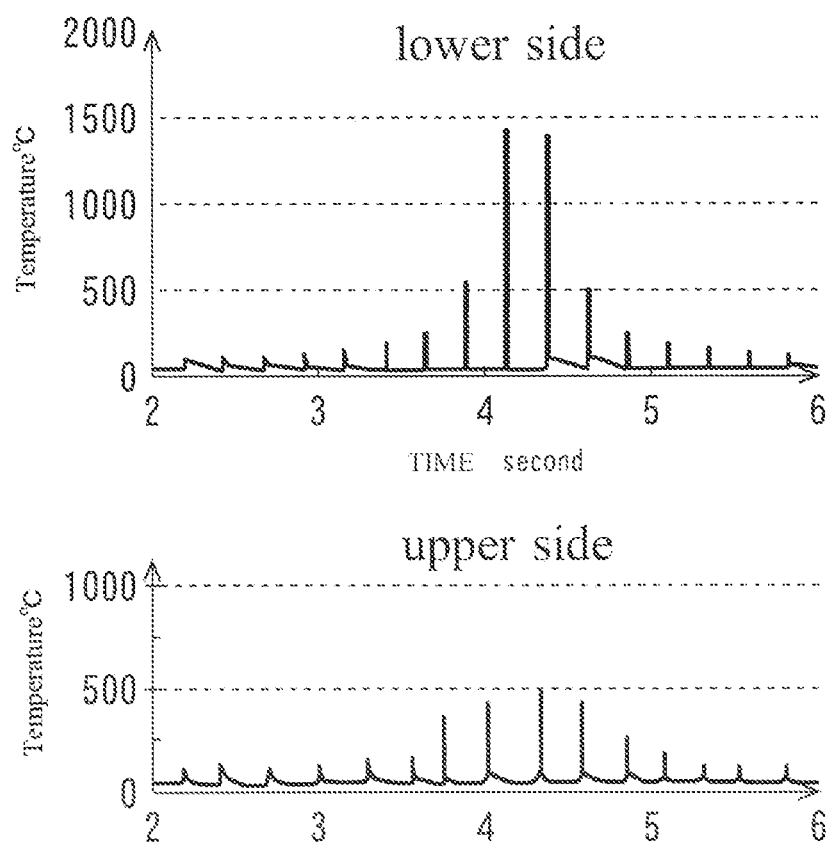
FIG. 7 is a diagram showing changes in temperature of the heating object in a case where the method of producing a semiconductor device according to Embodiment 1 of the present invention is used.

FIG. 7 is a diagram showing changes in temperature of the heating object in a case where the method of producing a semiconductor device according to Embodiment 1 of the present invention is used. A point of measurement exists, for example, in a place indicated by P1 in FIG. 3. At a time when the point of measurement is scanned with the second application region, the temperature at the point of measurement is maximized. Before this time, scanning with the second application region is performed mainly above the point of measurement as viewed in plan. After this time, scanning with the second application region is performed mainly below the point of measurement as viewed in plan. The scanning speed is 400 [m/min]. After a temperature peak rises, the temperature is returned generally to ordinary temperature at the latest at a time immediately before the next peak appears. After heating, therefore, heat is immediately released from the heating object and substantially no amount of heat is accumulated. As a result, the temperature of the upper surface of the heating object is maintained at a low value.

Figure 8:
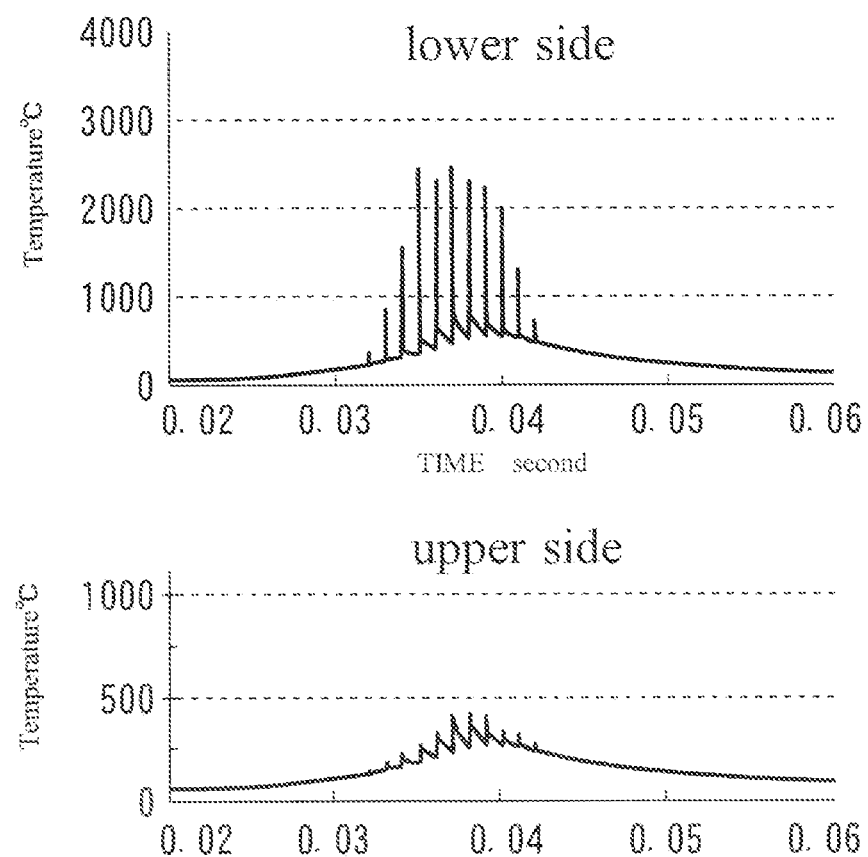
FIG. 8 is a diagram showing changes in temperature of the beating object in the case where pulse laser light is used.

FIG. 8 is a diagram showing changes in temperature of the heating object in the case where pulse laser light is used. In order to avoid application non-uniformity on the heating object, the speed of scanning with the application region is reduced in comparison with the case where continuous light is used. The scanning speed is 4.2 [m/min]. After a temperature peak rises, the temperature is not returned to ordinary temperature immediately before the next temperature peak appears. Accordingly, heat is accumulated in the heating object. As a result, the temperature of the upper surface of the heating object is high.

Thus, scanning with the first application region and the second application region can be performed at a high speed by using continuous laser light. By performing high-speed scanning with the first application region and the second application region, the temperature of the lower surface is made sufficiently high and the impurities in the buffer layer 64 and the collector layer 66 are diffused and activated. Also, the increase in temperature of the upper surface can be limited thereby. Keeping the temperature of the upper surface low ensures that no changes are caused in the diffusion layer and other portions at the upper surface side of the substrate, and that the desired reliability of the emitter electrode 62 formed of aluminum can be secured.

In the laser annealing device and the method of producing a semiconductor device according to Embodiment 1 of the present invention, the absorption coefficient (with respect to the second continuous laser light) of each portion of the heating object is increased by scanning with the first application region and the heating object is thereafter scanned with the second application region. An annealing process at a higher temperature is thereby enabled in comparison with the case where scanning with only the second application region is performed. In Embodiment 1 of the present invention, it is difficult to heat the heating object to a high temperature, since the speed of scanning with the first application region and the second application region is increased. It is, therefore, important to increase the absorption coefficient of the heating object by preliminary heating with the first application region.

Figure 9:
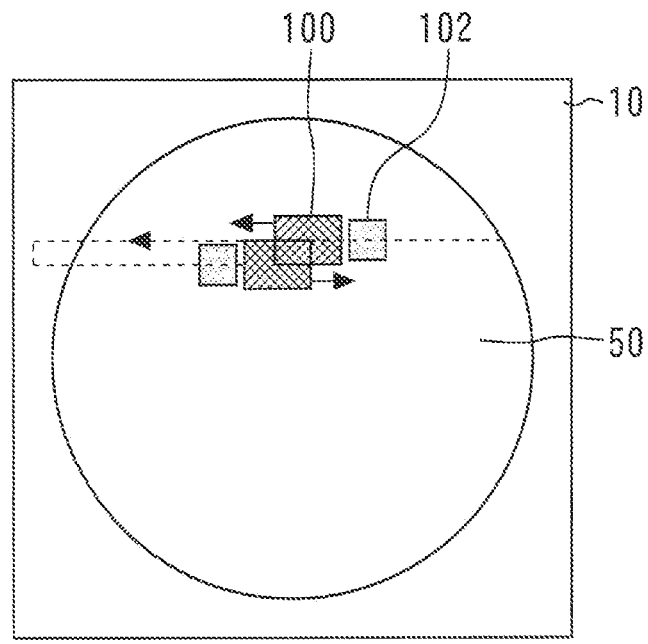
FIG. 9 is a diagram showing example of scanning method.
Figure 10:
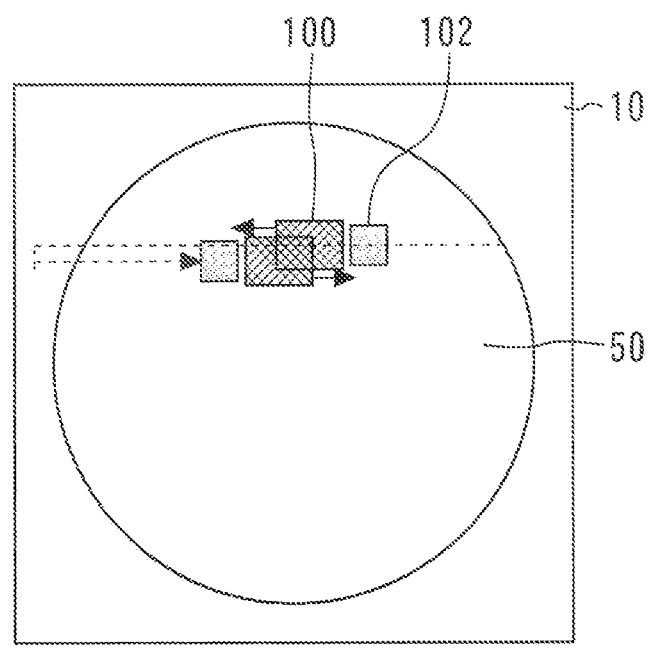
FIG. 10 is a diagram showing example of scanning method.

½ to ⅔ of the region scanned with the first application region and the second application region may be again scanned with the first application region and the second application region under the system controller 14. FIG. 9 is a plan view showing scanning with the first application region and the second application region again performed on ½ of the region scanned with the first application region and the second application region. FIG. 10 is a plan view showing scanning with the first application region and the second application region again performed on ⅔ of the region scanned with the first application region and the second application region. If part of the portion scanned with the first application region and the second application region is again scanned with the first application region and the second application region, laser light can be applied to the heating object without omission and the lower surface of the heating object can thereby be heated uniformly.

Scanning with the first application region and the second application region may be performed in such a manner that the region presently scanned does not overlap the region already scanned with the first application region and the second application region and there is no gap between the region presently scanned and the region already scanned under the system controller 14. In such a case, the scanning distance for scanning the entire heating object can be shortened to enable the process to be completed in a shorter time period.

Preferably, the laser annealing device and the method of producing a semiconductor device according to the present invention are used for annealing on one of the upper and lower surfaces of the heating object in which diffusion layers are formed. A heating object which has diffusion layers formed in its upper and lower surfaces and which is to undergo a heat treatment at the lower surface side is, for example, an IGBT, a MOSFET or a diode.

Figure 11:
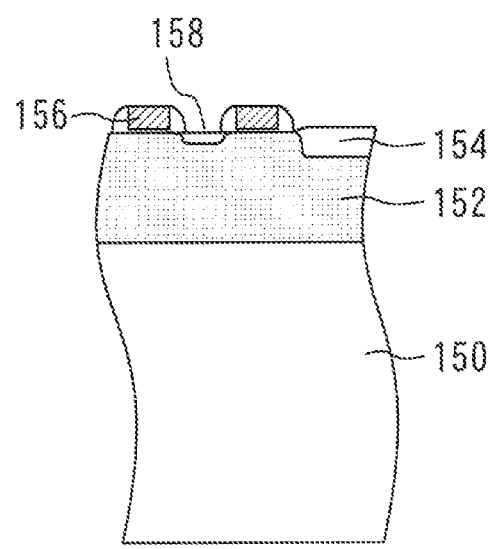
FIG. 11 is a sectional view of a memory.

However, a heating object having a diffusion layer formed in only one of its upper and lower surfaces may be heated. A heating object having a diffusion layer only in its upper surface is, for example, a memory, a microcomputer or a power discrete. FIG. 11 is a sectional view of a memory. A process of manufacturing a memory will be briefly described. First, a well diffusion region 152, an element separation 154 and a gate electrode 156 are formed on an upper surface of a semiconductor substrate 150. Subsequently, an impurity for forming a source/drain diffusion layer 158 is introduced into the semiconductor substrate 150 by ion implantation for example.

The upper surface of the semiconductor substrate 150 is then heated by the laser annealing device according to Embodiment 1 of the present invention to diffuse and activate the impurity for forming the source/drain diffusion layer 158. After laser annealing, metal wiring using aluminum for example is formed and the wafer is ground at its lower surface side according to use of the semiconductor device. The material of the heating object in Embodiment 1 of the present invention is, for example, Si, SiC or GaN, though not particularly limited to this.

In some cases, the source/drain diffusion layer is shallowly formed in order to miniaturize a semiconductor device (heating object). With the laser annealing device according to Embodiment 1 of the present invention, an annealing process can be performed at a high temperature in a short time period and, therefore, a shallow diffusion layer can be obtained by limiting diffusion of an impurity.

The wavelengths of the first continuous laser light and the second continuous laser light are not particularly specified as long as the wavelength of the first continuous laser light is longer than that of the second continuous laser light. For example, any of laser elements shown in FIG. 12 can be selected as desired.

The first continuous laser light and the second continuous laser light may be applied so as to be perpendicularly or obliquely incident on the heating object. Scanning with the first application region and the second application region may be performed by gradually changing the angle of this incidence. These modifications can also be applied to laser annealing devices and methods of producing a semiconductor device according to embodiments described below.

Embodiment 2

Figure 13:
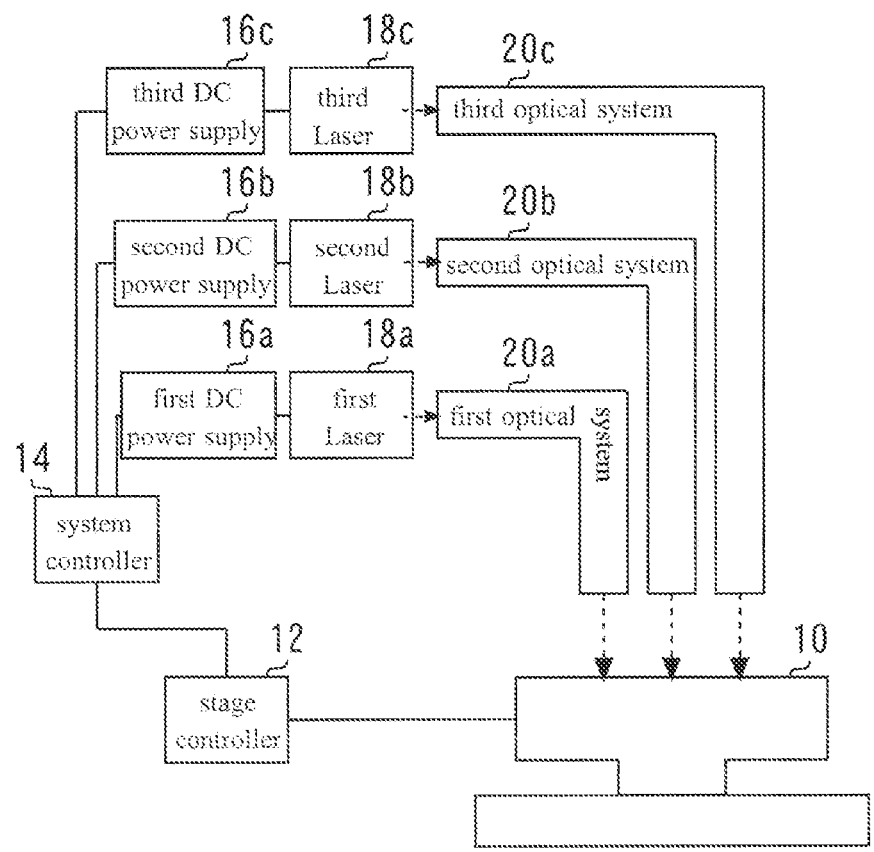
FIG. 13 is a front view of the laser annealing device according to Embodiment 2 of the present invention.

A laser annealing device and a method of producing a semiconductor device according to Embodiment 2 of the present invention have a number of commonalities with Embodiment 1 and will therefore be described mainly with respect to points of difference from Embodiment 1. FIG. 13 is a front view of the laser annealing device according to Embodiment 2 of the present invention. This laser annealing device is provided with a third direct-current power supply 16c connected to the system controller 14.

A third laser element 18c is connected to the third direct-current power supply 16c. The third laser element 18c is supplied with a direct-current voltage from the third direct-current power supply 16c and emits third continuous laser light of a wavelength longer than that of the second continuous laser light. A third optical system 20c leads the third continuous laser light to the heating object and forms a third application region on the heating object. The third application region is a region on the heating object occupied by the third continuous laser light applied.

Figure 14:
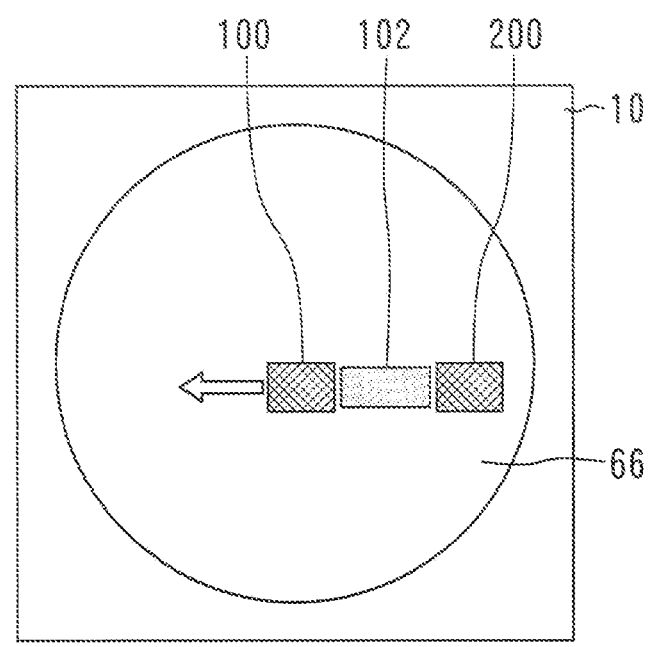
FIG. 14 is a plan view showing disposition of the first application region, the second application region and the third application region.

FIG. 14 is a plan view showing disposition of the first application region 100, the second application region 102 and the third application region 200. The system controller 14 executes scanning with the third application region 200 so that each portion of the heating object is scanned with the third application region 200 after being scanned with the second application region 102.

There is a possibility of occurrence of damage such as a crystal defect to the heating object due to scanning with the second application region 102 or any other preceding process step. By scanning with the third application region 200 after scanning with the second application region 102, recovery from such damage can be made. Thus, final heating in the laser annealing process is executed with laser light of a comparatively long wavelength to recover the heating object from damage. Laser light for obtaining this effect is not limited to continuous light. Pulse light may suffice. The same can also be said with respect to the embodiments described below.

Embodiment 3

Figure 15:
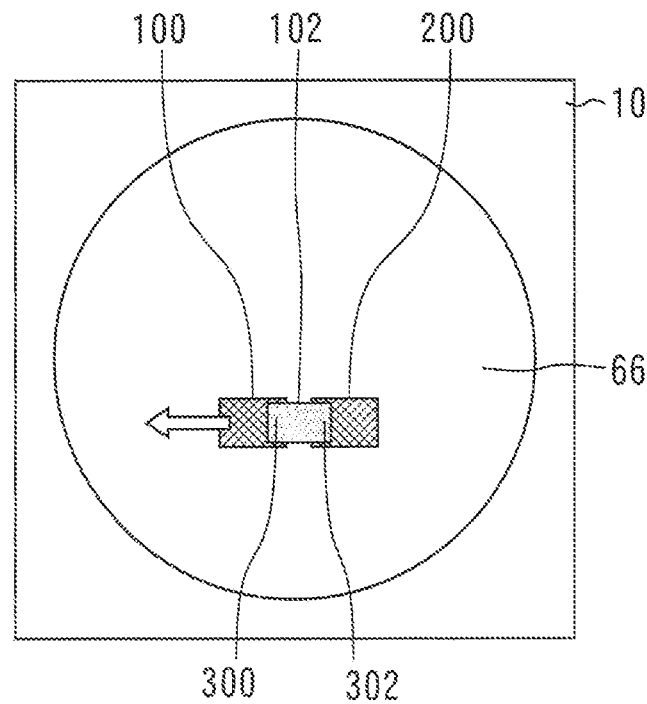
FIG. 15 is a plan view showing the first application region, the second application region and the third application region according to Embodiment 3 of the present invention.

A laser annealing device and a method of producing a semiconductor device according to Embodiment 3 of the present invention have a number of commonalities with Embodiment 2 and will therefore be described mainly with respect to points of difference from Embodiment 2. FIG. 15 is a plan view showing the first application region 100, the second application region 102 and the third application region 200 according to Embodiment 3 of the present invention. An overlap region 300 is formed by a portion of the first application region 100 and a portion of the second application region 102 overlapping each other. An overlap region 302 is formed by a portion of the second application region 102 and a portion of the third application region 200 overlapping each other.

Overlap regions 300 and 302 are formed by adjusting the relative positions of the first laser element 18a, the first optical system 20a, the second laser element 18b, the second optical system 20b, the third laser element 18c and the third optical system 20c. More specifically, the overlap region 300 is formed by reducing the distance between the first laser element 18a and the second laser element 18b or adjusting the focal lengths of the first optical system 20a and the second optical system 20b. The overlap region 302 is also formed in the same way. Because of the formation of the overlap regions 300 and 302, the width in the scanning direction can be reduced in comparison with that in Embodiment 2. The time period taken to perform laser annealing can therefore be reduced.

Figure 16:
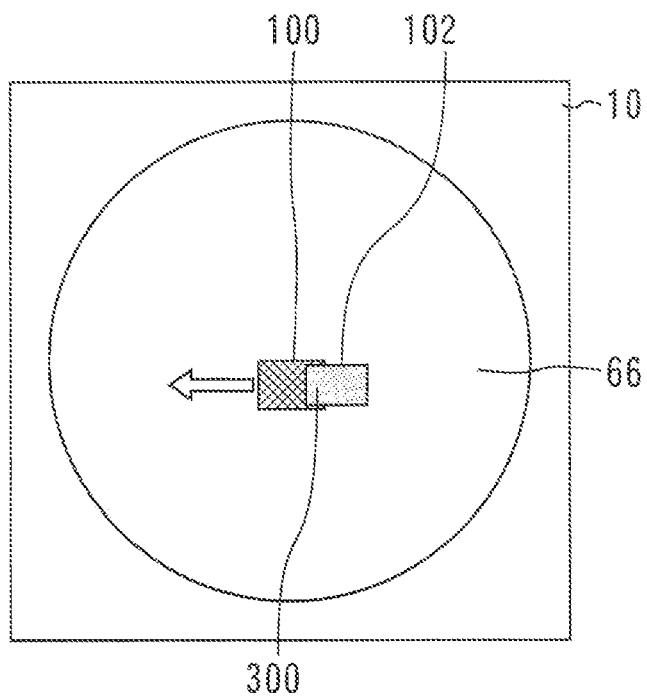
FIG. 16 is a plan view showing a modified example of the laser annealing device according to Embodiment 3 of the present invention.

FIG. 16 is a plan view showing a modified example of the laser annealing device according to Embodiment 3 of the present invention. If there is no need for recovery of the heating object from damage, the third application region may be removed, as shown in FIG. 16.

Embodiment 4

A laser annealing device and a method of producing a semiconductor device according to Embodiment 4 of the present invention have a number of commonalities with Embodiment 3 and will therefore be described mainly with respect to points of difference from Embodiment 3.

Figure 17:
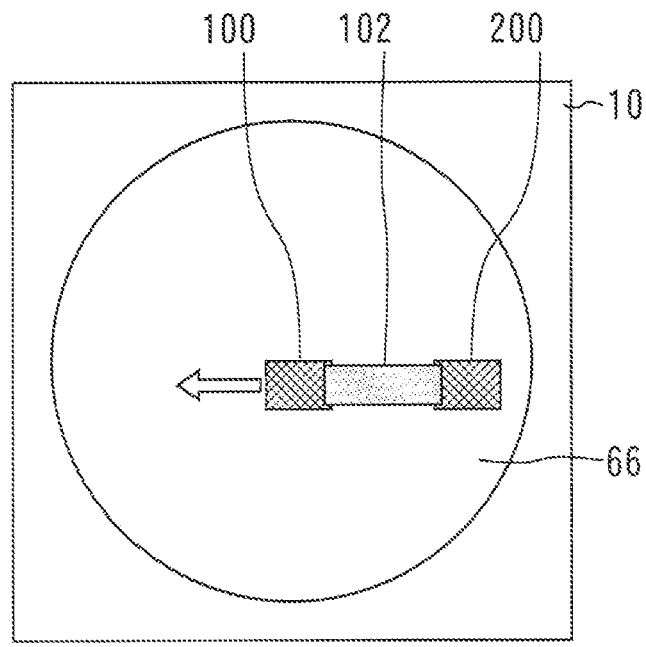
FIG. 17 is a plan view showing the first application region, the second application region and the third application region according to Embodiment 4 of the present invention.

FIG. 17 is a plan view showing the first application region 100, the second application region 102 and the third application region 200 according to Embodiment 4 of the present invention. The width of the second application region 102 in the scanning direction is longer than the width of the first application region 100 in the scanning direction. The time for heating with the second continuous laser light having a shorter wavelength can therefore be increased to enable heating the heating object so that the temperature of even an inner portion of the heating object is high.

Figure 18:
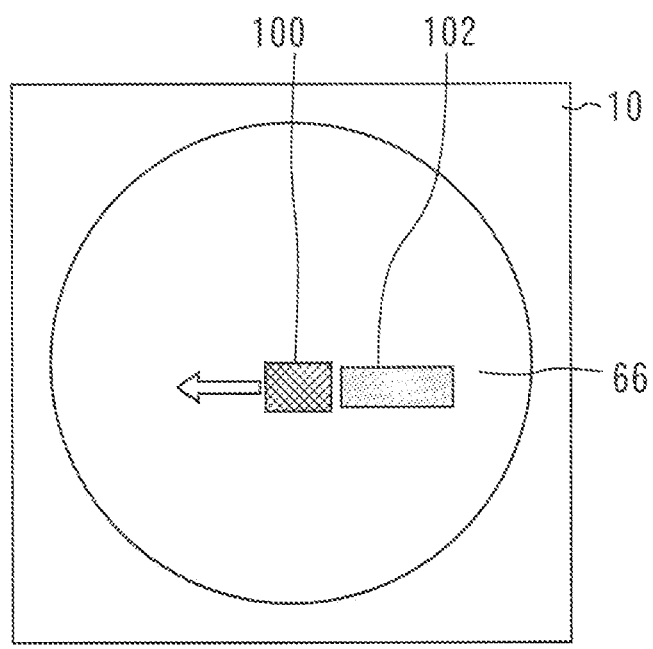
FIG. 18 is a plan view showing a modified example of the laser annealing device according to Embodiment 4.
Figure 19:
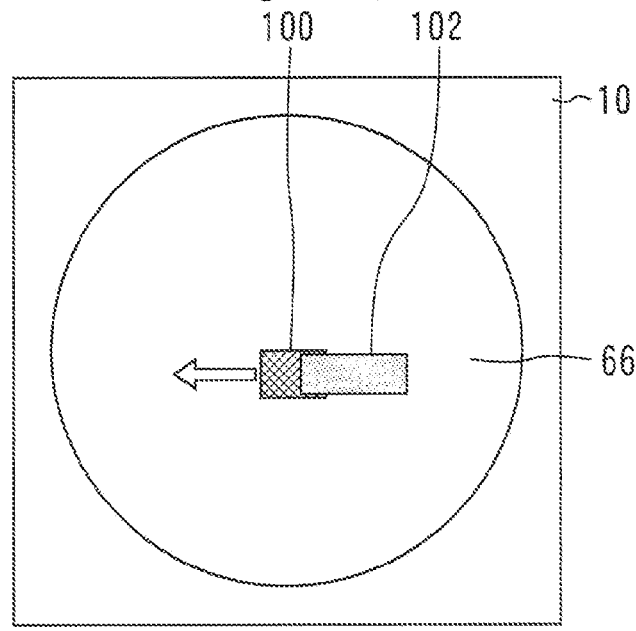
FIG. 19 is a plan view showing another modified example of the laser annealing device according to Embodiment 4.
Figure 20:
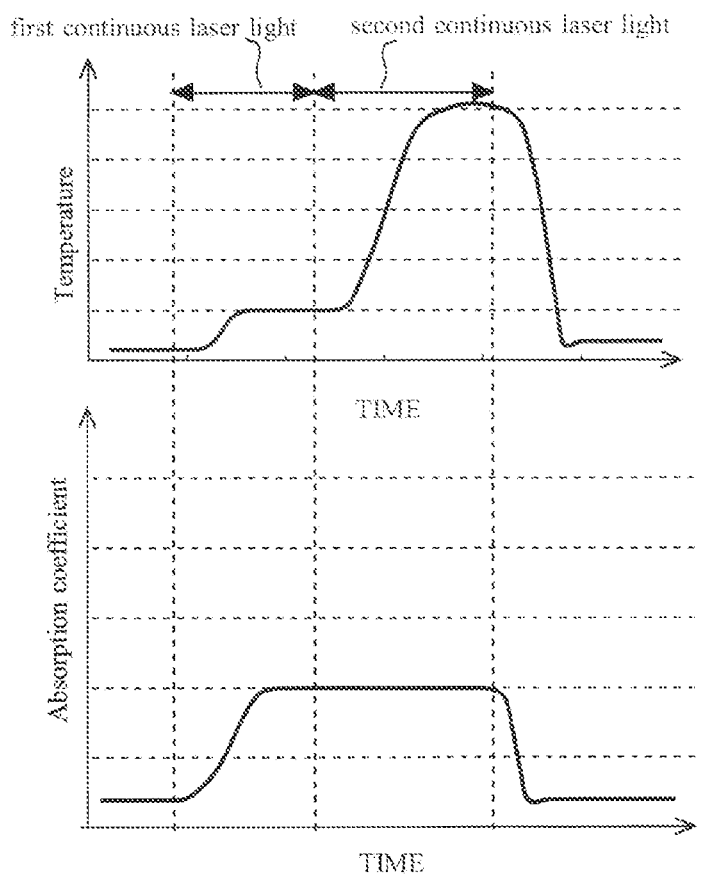
FIG. 20 is a diagram showing changes in temperature and changes in absorption coefficient of the heating object in the case shown in FIG. 18.
Figure 21:
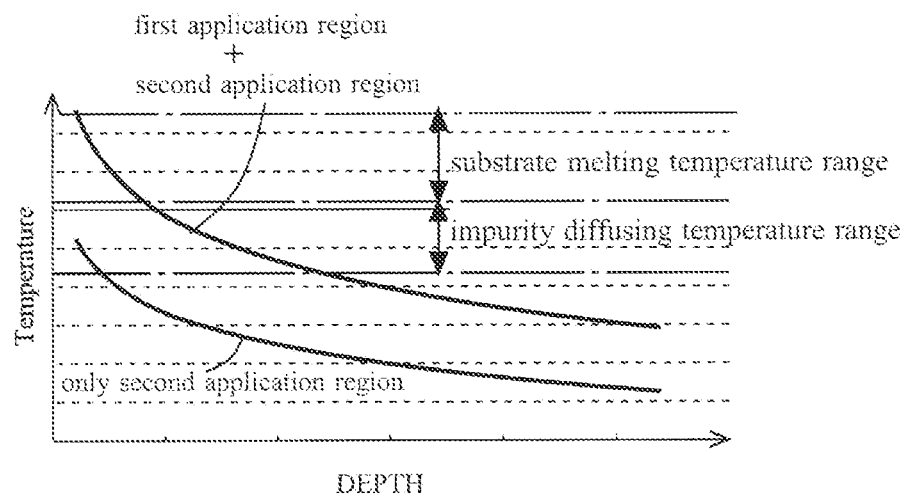
FIG. 21 is a diagram showing a temperature distribution in the depth direction in the heating object in the case shown in FIG. 18.

FIG. 18 is a plan view showing a modified example of the laser annealing device according to Embodiment 4. The third application region for recovery of the heating object from damage can be removed, as in this modified example. FIG. 19 is a plan view showing another modified example of the laser annealing device according to Embodiment 4. A portion of the first application region 100 and a portion of the second application region 102 may overlap each other while the third application region is removed, as in this modified example. FIG. 20 is a diagram showing changes in temperature and changes in absorption coefficient of the heating object in the case shown in FIG. 18. The temperature reached at the point of measurement can be increased by increasing the time for heating with the second continuous laser light. FIG. 21 is a diagram showing a temperature distribution in the depth direction in the heating object in the case shown in FIG. 18.

Embodiment 5

Figure 22:
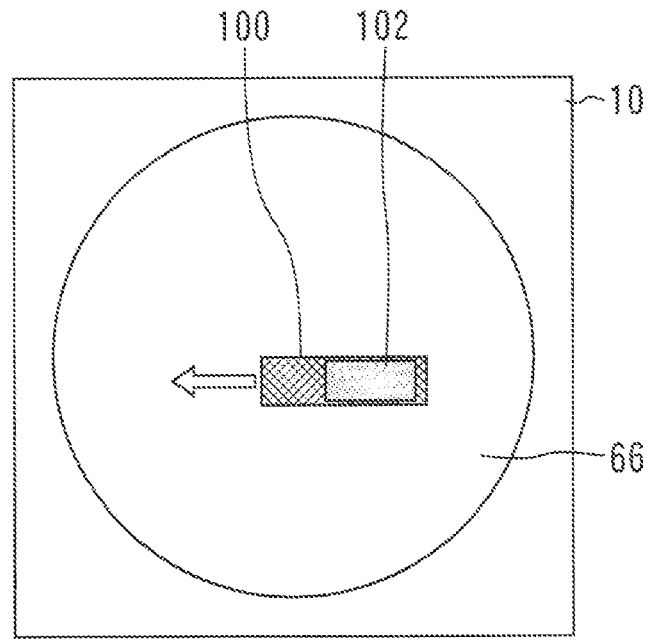
FIG. 22 is a plan view showing the first application region and the second application region according to Embodiment 5 of the present invention.

A laser annealing device and a method of producing a semiconductor device according to Embodiment 5 of the present invention have a number of commonalities with Embodiment 1 and will therefore be described mainly with respect to points of difference from Embodiment 1. FIG. 22 is a plan view showing the first application region 100 and the second application region 102 according to Embodiment 5 of the present invention. The width of the first application region 100 in the scanning direction is longer than the width of the second application region 102 in the scanning direction. This setting ensures that the absorption coefficient of the heating object can be stably increased with the first application region 100. Further, part of the first application region 100 is extended rearward in the scanning direction beyond the second application region 102. Recovery of the heating object from damage is also enabled thereby.

Figure 23:
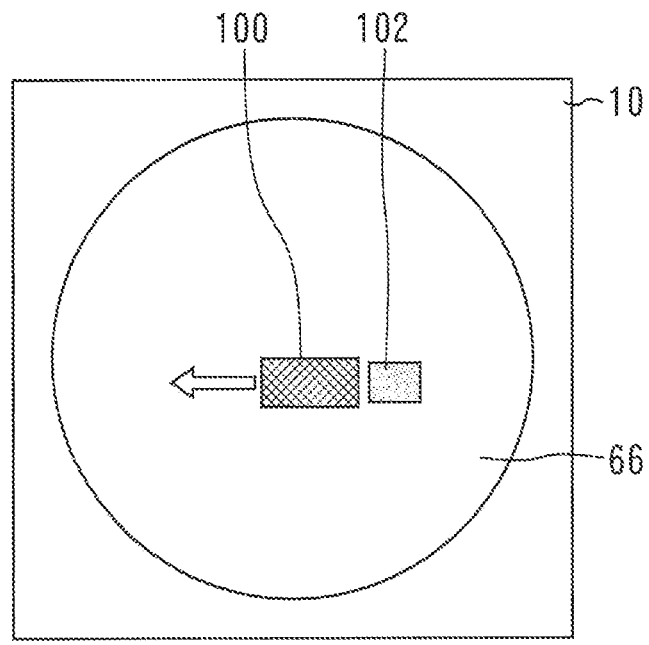
FIG. 23 is a plan view showing a modified example of the laser annealing device according to Embodiment 5 of the present invention.

FIG. 23 is a plan view showing a modified example of the laser annealing device according to Embodiment 5 of the present invention. The width of the first application region 100 in the scanning direction is set longer than the width of the second application region 102 in the scanning direction, thereby enabling adequate preliminary heating and recovery of the heating object from damage.

Embodiment 6

Figure 24:
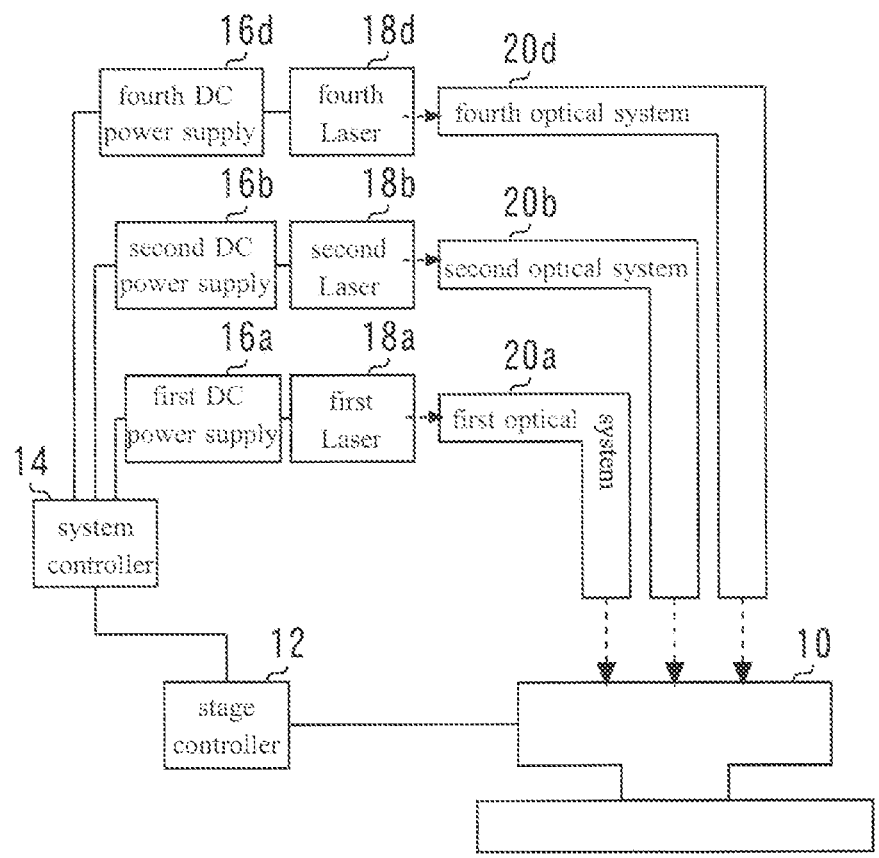
FIG. 24 is a front view of the laser annealing device according to Embodiment 6 of the present invention.

A laser annealing device and a method of producing a semiconductor device according to Embodiment 6 of the present invention have a number of commonalities with Embodiment 1 and will therefore be described mainly with respect to points of difference from Embodiment 1. FIG. 24 is a front view of the laser annealing device according to Embodiment 6 of the present invention. A fourth direct-current power supply 16*d* is connected to the system controller 14. A fourth laser element 18*d* is connected to the fourth direct-current power supply 16*d*. The fourth laser element 18*d* is supplied with a direct-current voltage from the fourth direct-current power supply 16*d* and emits fourth continuous laser light of a wavelength shorter than that of the first continuous laser light. A fourth optical system 20*d* leads the fourth continuous laser light to the heating object and forms a fourth application region on the heating object. The fourth application region is a region on the heating object occupied by the fourth continuous laser light applied.

Figure 25:
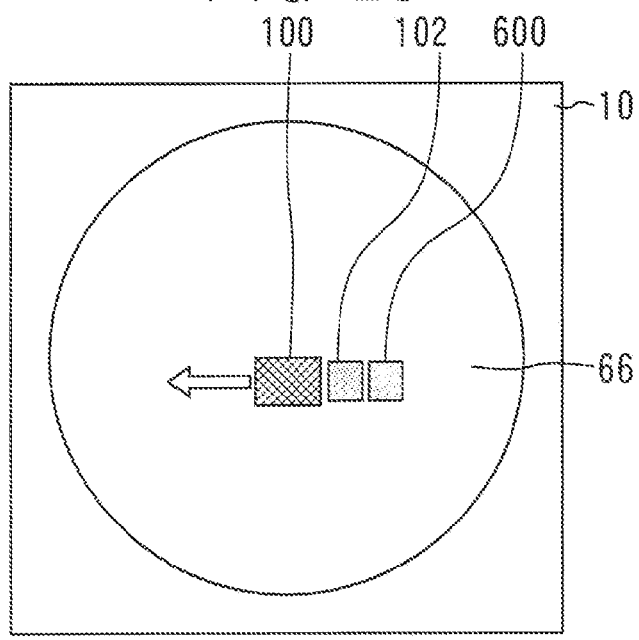
FIG. 25 is a plan view showing the first application region, the second application region and the fourth application region according to Embodiment 6 of the present invention.

FIG. 25 is a plan view showing the first application region 100, the second application region 102 and the fourth application region 600. The system controller 14 executes scanning with the fourth application region 600 so that each portion of the heating object is scanned with the fourth application region 600 after being scanned with the second application region 102.

Figure 26:
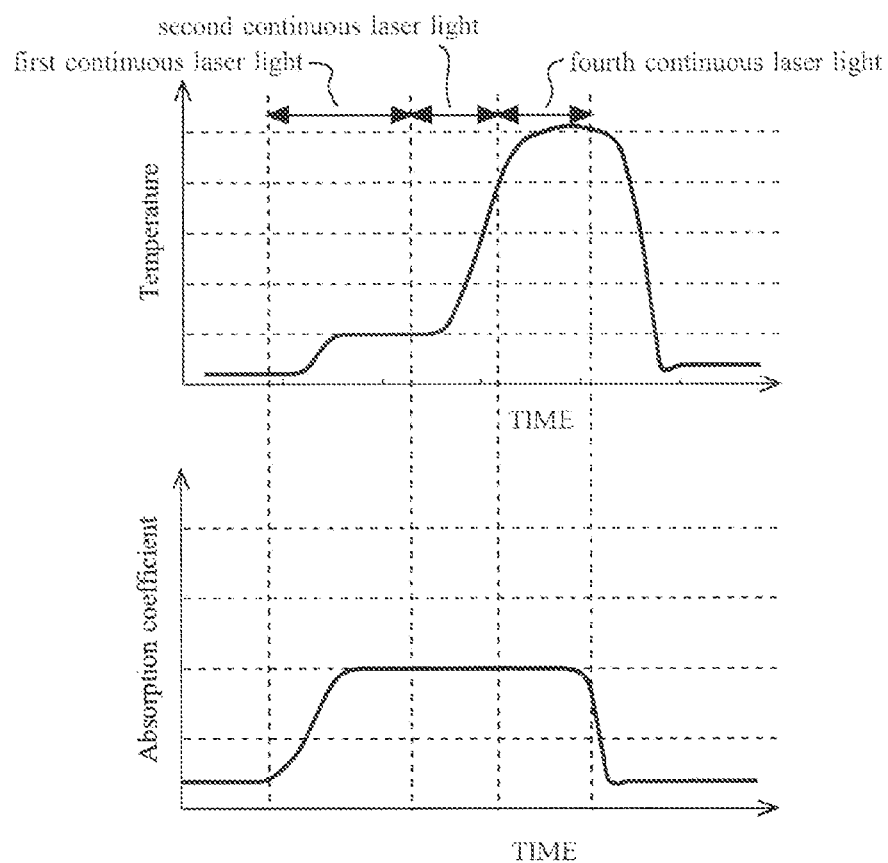
FIG. 26 is a diagram showing changes in temperature and changes in absorption coefficient of the heating object as a result of scanning with the first application region, the second application region and the fourth application region.
Figure 27:
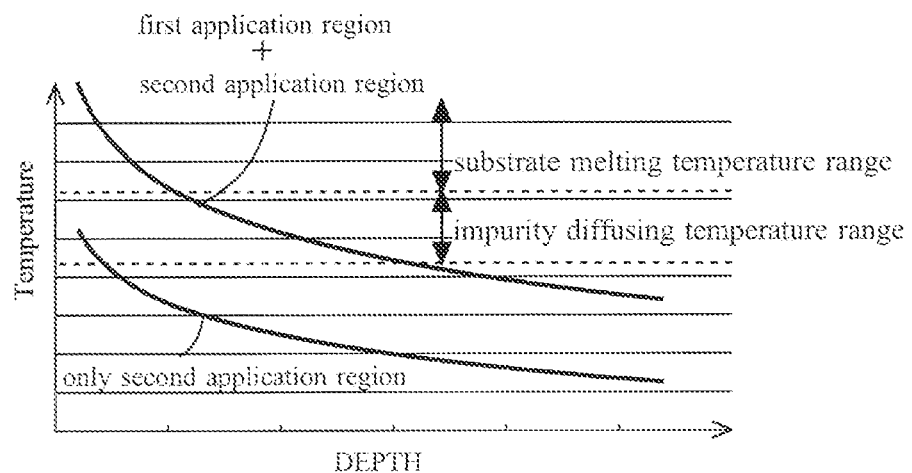
FIG. 27 is a diagram showing a temperature distribution in the heating object depth direction.
Figure 28:
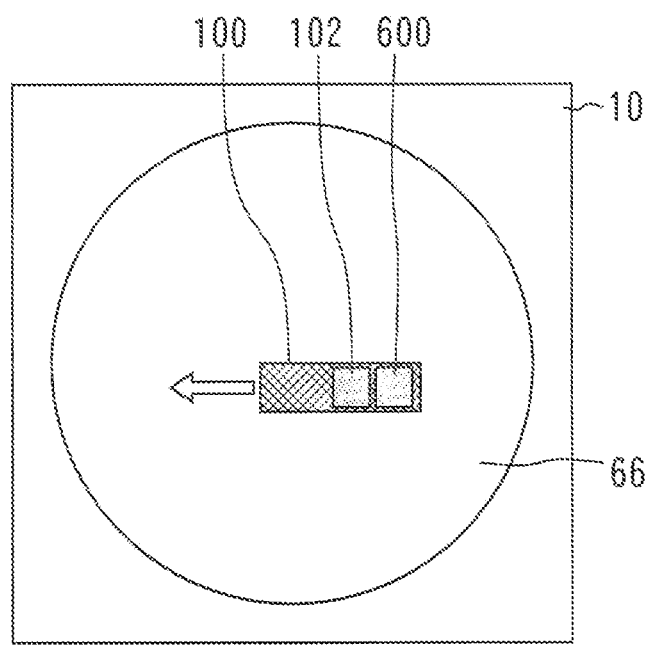
FIG. 28 is a plan view showing a modified example of the annealing apparatus according to Embodiment 6 of the present invention.

The time period for heating the heating object can be increased by using a plurality of laser elements each of which emits laser light of a wavelength shorter than the wavelength of the first continuous laser light. FIG. 26 is a diagram showing changes in temperature and changes in absorption coefficient of the heating object as a result of scanning with the first application region, the second application region and the fourth application region. A higher temperature of the lower surface of the heating object is reachable in comparison with Embodiment 1 as a result of addition of the fourth application region. FIG. 27 is a diagram showing a temperature distribution in the heating object depth direction. FIG. 28 is a plan view showing a modified example of the annealing apparatus according to Embodiment 6 of the present invention. Part of the first application region 100 is extended rearward in the scanning direction beyond the second application region 102 and the fourth application region 600. Recovery from damage due to scanning with the second application region 102 and the fourth application region 600 is thereby enabled.

A combination of some of the features of the laser annealing devices and the methods of producing semiconductor devices according to Embodiments 1 to 6 described above may be made as desired.

Description Of Symbols

10 stage, 12 stage controller, 14 system controller, 16*a* first direct-current power supply, 16*b* second direct-current power supply, 16*c* third direct-current power supply, 16*d* fourth direct-current power supply, 18*a* first laser element, 18*b* second laser element, 18*c* third laser element, 18*d* fourth laser element, 20*a* first optical system, 20*b* second optical system, 20*c* third optical system, 20*d* fourth optical system, 50 heating object, 100 first application region, 102 second application region, 200 third application region, 300,302 overlap regions, 600 fourth application region

The invention claimed is:

1. A laser annealing device comprising:
   a stage on which a heating object is placed;
   a first laser element which emits first continuous laser light;
   a first optical system which leads the first continuous laser light to the heating object to form a first application region on the heating object;
   a second laser element which emits second continuous laser light having a wavelength shorter than that of the first continuous laser light;
   a second optical system which leads the second continuous laser light to the heating object to form a second application region on the heating object;
   a system controller which executes scanning with the first application region and the second application region so that each portion of the heating object is scanned with at least part of the first application region before being scanned with the second application region;
   a third laser element which emits third continuous laser light having a wavelength longer than that of the second continuous laser light; and
   a third optical system which leads the third continuous laser light to the heating object to form a third application region on the heating object,
   wherein the system controller executes scanning with the third application region so that each portion of the heating object is scanned with the third application region after being scanned with the second application region.

2. The laser annealing device according to claim 1, wherein the system controller executes scanning with the first application region and the second application region so that the scanning speed is 50 to 1000 m/min.

3. A laser annealing device comprising:
   a stage on which a heating object is placed;

a first laser element which emits first continuous laser light;

a first optical system which leads the first continuous laser light to the heating object to form a first application region on the heating object;

a second laser element which emits second continuous laser light having a wavelength shorter than that of the first continuous laser light;

a second optical system which leads the second continuous laser light to the heating object to form a second application region on the heating object;

a system controller which executes scanning with the first application region and the second application region so that each portion of the heating object is scanned with at least part of the first application region before being scanned with the second application region;

a third laser element which emits third continuous laser light having a wavelength shorter than that of the first continuous laser light; and a third optical system which leads the third continuous laser light to the heating object to form a third application region on the heating object, wherein the system controller executes scanning with the third application region so that each portion of the heating object is scanned with the third application region after being scanned with the second application region.

4. The laser annealing device according to claim 1, wherein the first laser element, the first optical system, the second laser element and the second optical system are disposed so that a portion of the first application region and a portion of the second application region overlap each other.

5. The laser annealing device according to claim 1, wherein the width of the second application region in a scanning direction is larger than the width of the first application region in the scanning direction.

6. The laser annealing device according to claim 1, wherein the width of the first application region in a scanning direction is larger than the width of the second application region in the scanning direction.

7. The laser annealing device according to claim 6, wherein part of the first application region is extended rearward in the scanning direction beyond the second application region.

8. The laser annealing device according to claim 1, wherein the system controller again executes scanning with the first application region and the second application region on ½ to ⅔ of the region already scanned with the first application region and the second application region.

9. The laser annealing device according to claim 1, wherein the system controller executes scanning with the first application region and the second application region on a region not overlapping the region already scanned with the first application region and the second application region, with no gap formed between the region already scanned and the region presently scanned.

\* \* \* \* \*